United States Patent
Jeng et al.

(10) Patent No.: US 7,777,267 B2
(45) Date of Patent: Aug. 17, 2010

(54) MANUFACTURE METHOD AND STRUCTURE OF A NONVOLATILE MEMORY

(76) Inventors: Erik S Jeng, No. 200, Chung-Pei Rd., Chung-Li, Tao-Yuan 32023 (TW);
Wu-Ching Chou, No. 200, Chung-Pei Rd., Chung-Li, Tao-Yuan 32023 (TW);
Chih-Hsueh Hung, No. 200, Chung-Pei Rd., Chung-Li, Tao-Yuan 32023 (TW);
Chien-Cheng Li, No. 200, Chung-Pei Rd., Chung-Li, Tao-Yuan 32023 (TW)

( * ) Notice: Subject to any disclaimer, the term of this patent is extended or adjusted under 35 U.S.C. 154(b) by 27 days.

(21) Appl. No.: 11/969,119

(22) Filed: Jan. 3, 2008

(65) Prior Publication Data
US 2008/0150048 A1  Jun. 26, 2008

Related U.S. Application Data

(63) Continuation of application No. 10/758,132, filed on Jan. 16, 2004, now abandoned.

(51) Int. Cl.
*H01L 29/94* (2006.01)
(52) U.S. Cl. .................................. 257/311; 257/310
(58) Field of Classification Search ................ 257/324, 257/296, 310, 311
See application file for complete search history.

(56) References Cited

U.S. PATENT DOCUMENTS

| 4,683,645 | A | 8/1987 | Naguib et al. |
| 4,870,470 | A | 9/1989 | Bass, Jr. et al. |
| 5,371,027 | A | 12/1994 | Walker et al. |
| 5,714,766 | A * | 2/1998 | Chen et al. ................ 257/17 |
| 6,274,903 | B1 * | 8/2001 | Nomoto et al. ............ 257/317 |
| 7,015,101 | B2 | 3/2006 | Zheng et al. |
| 7,202,523 | B2 * | 4/2007 | Forbes ..................... 257/324 |

* cited by examiner

*Primary Examiner*—Wai-Sing Louie
*Assistant Examiner*—Bilkis Jahan
(74) *Attorney, Agent, or Firm*—WPAT, PC; Justin King

(57) ABSTRACT

The manufacturing method of a nonvolatile memory and its structure is achieved by building a gate dielectric layer on a base. The gate dielectric contains at least two layers of different material layers. At least one hetero element is planted on the top of the gate dielectric layer so as to increase the electronic trap density. Then rebuild a new top material after removing the upmost layer of material. Finally, build a gate electrode layer on the gate dielectric layer and form source/drain electrodes at the bases of both sides of the gate dielectric layer. In this invention, with the planting of the hetero element, it will form traps in the gate dielectric layer that can catch electrons more easily. Thus, the electrons won't combine together with the increase of operation time. The storage time can be effectively extended and the problem of the combination of bites can be solved.

2 Claims, 3 Drawing Sheets

MANUFACTURE METHOD AND STRUCTURE OF A NONVOLATILE MEMORY

CROSS REFERENCE TO RELATED PATENT APPLICATION

This patent application is a continuation application of a U.S. patent application Ser. No. 10/758,132 filed on Jan. 16, 2004 and now pending. The contents of the related patent application are incorporated herein for reference.

DESCRIPTION OF THE INVENTION

This invention is regarded to the manufacturing method and its structure of a nonvolatile memory, especially for the manufacturing method and its structure of a flash memory nonvolatile memory with electrons capturing element units.

Recent years, with the fast development in the semiconductors, the technique in the non-volatile memory is highly promoted. Start from the early Read Only Memory (ROM), Programmed Read Only Memory (PROM), to the more recent Erasable Programmed Read Only Memory (EPROM), Electronic Erasable Programmed Read Only Memory (EEPROM) and flash memory. Among these, the flash memory element units are becoming more popular with the booming of portable electronic products. The role of the flash memory is getting more important and will have better competition potential in the market.

As to the non-volatile memories, there are two kinds of different structures existed in the same time. One of them is the floating gate device while the other one is the charge-trapping device. The structure shown in FIG. 1 is the non-volatile memory with the floating gate device. The way it memorize is through the storage of electrons on the floating gate 10. It will create a shift in the critical potential and then determines whether memory should be done or not.

As shown in FIG. 2 is the structure of the well-known memory of the charge-trapping device type. On the base 20 in the bottom, for example silicon base, two layers of insulators are piled together, including one oxide layer 22, for example silicon dioxide and one electron storing layer 24, for example silicon nitride ($Si_3N_4$) or aluminum oxide ($Al_2O_3$) to construct a gate dielectric layer 26. But the gate dielectric layers are not limited to two layers. You can also use structure with more than two layers. Finally, on the top of this gate dielectric layer 26, there is a gate layer G As to the source electrode S and the drain electrode D, they are located at the inner side of the base 20 of both sides of the gate dielectric layer 26. The above-mentioned charge storage layer 24 has high dee-level trap density. It is capable to hold the electrons effectively thus achieve the purpose of charge storage.

With this type of charge capturing element unit, the memory can store one bite separately on both side of the charge storage layer 24 (which implies to have dual bite storage in one memory cell). In contrast, the normal floating gate element unit type non-volatile memory, of which one memory cell can only store one bite. Without changing the size of the memory, the former one can effectively increase the capacity of the memory.

However, there is a big problem in the retention time of the above-mentioned structure. As the bottom oxide layer 22 will also trap a positive charge during the writing process, the energy barrier of the bottom oxide layer 22 will be lowered. Therefore the electron trapped in the charge storage layer 24 will be more easily to pass through the bottom oxide layer 22. This will cause the loss of stored electrons and shorten the retention time. Also, the electrons trapped at both side of the charge storage layer 24 will gradually combine together with the increase of operation time. Thus the original purpose of the dual bite storage will be gone.

In order to solve this issue, the main purpose of this invention is to bring up a way to manufacture and its structure of a kind of nonvolatile memory. With the planting of hetero element into the charge storage layer, the charge storage layer will have deeper electron trap density. This will make the electrons more stably stay in the charge storage layer and won't be that easy to loss away.

This invention proposes a manufacturing method for a non-volatile memory. First, build a gate dielectric layer on a base. The gate dielectric layer contains at least two layers of different material layers. At least one hetero element is planted on the top of the gate dielectric layer so as to increase the electronic trap density. Then rebuild a new top material after removing the up most layer of material. Finally, build a gate electrode layer on the gate dielectric layer and form source/drain electrodes at the bases of both sides of the gate dielectric layer.

This invention provides a kind of non-volatile memory structure, including: a base; a gate dielectric layer on the base, the gate dielectric layer has at least one kind of hetero element to increase the electron trapping density; a gate electrode layer on the top of the said gate dielectric layer; and a source/drain electrodes at the base on both sides of the said gate dielectric layer.

The structure and the manufacturing method of the non-volatile memory in this invention enable the gate dielectric layer to contain at least one kind of hetero elements, such as Germanium (Ge), Silicon (Si), Nitrogen (N_)~ Oxygen (O2) and so on or other synthetic materials. Therefore, the electron trapping density can be increased. Also the stored electron will stay more stably in the gate dielectric layer. Thus the goals of extending the retention time and solving the problem of bite combination can be achieved. The rebuilt of oxide layer on the top will also assure the electrons to stay more stably in the gate dielectric layer and won't loss away from the top oxide layer.

To make the above-mentioned purpose and other purposes, characteristics, and advantages of this invention to be more clear and easy to understand, the following text will cite some preferred examples iii combination with the attached figures to state more in detail as shown below:

Figure 1:
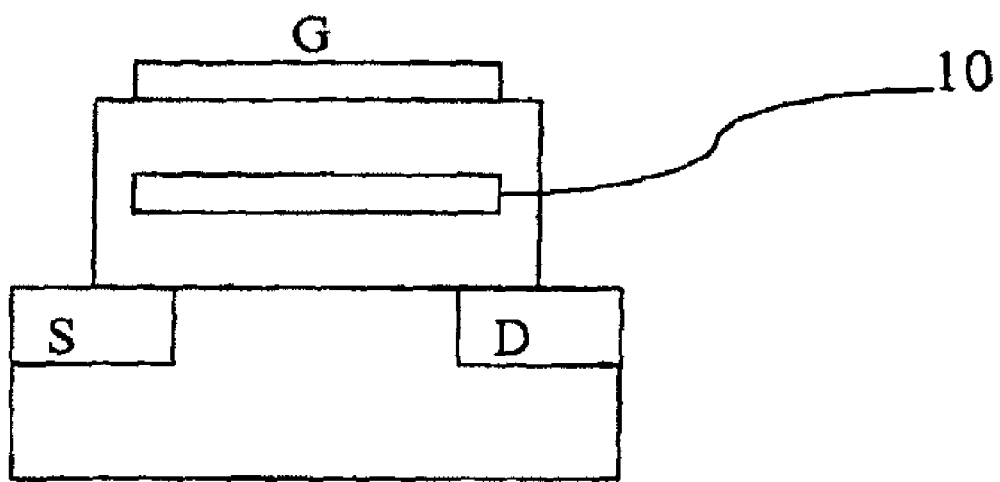
FIG. 1 is a schematic drawing of the structure of the well-known non-volatile memory of floating gate element unit type.
Figure 2:
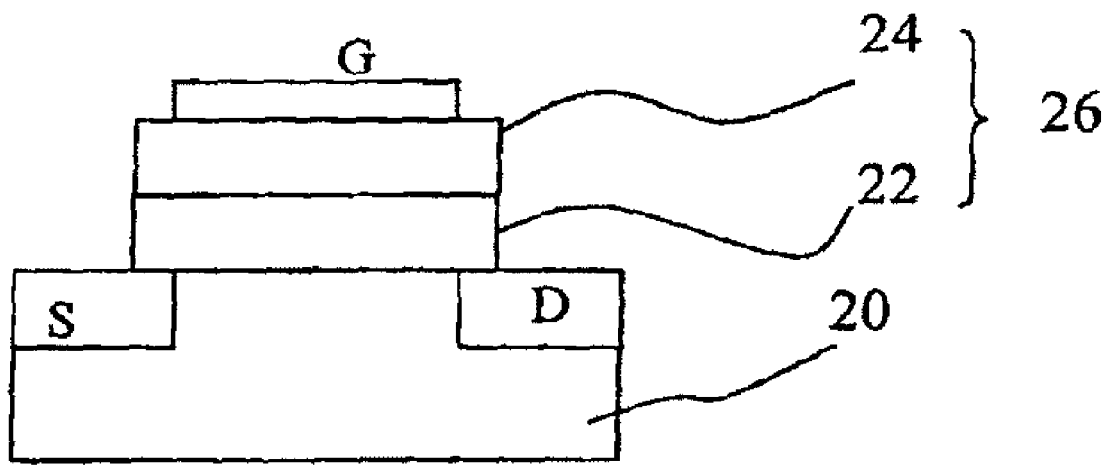
FIG. 2 is a schematic drawing of the structure of the well-known non-volatile memory of dual layers charge capturing element unit type.

The representing symbols of the key parts:
10: floating gate electrode
20, 40: base
22, 44, 48, 50: oxide layers
24, 46: charge storage layer
26, 42: gate dielectric layer
52: gate electrode layer The feature of this invention is to plant at least one kind of hetero element to the charge storage layer of the charge capturing unit element type non-volatile memory. For example, plant some elements such as Germanium (Ge), Silicon (Si), Nitrogen (N₂), Oxygen (O2) and so on or other synthetic materials on the charge storage layer formed by nitride compounds. The electron storage layers will create traps that can capture electron more easily. Also, the electrons will not be combined together along with the increase of operation time. Therefore, it can effectively extend the retention time and also effectively solve the bite combination problem.

Figure 3A:
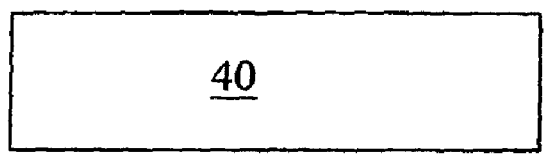
FIG. 3A~3E are schematic drawings of the manufacturing method of the non-volatile memory in according to a preferred example of this invention.
Figure 3B:
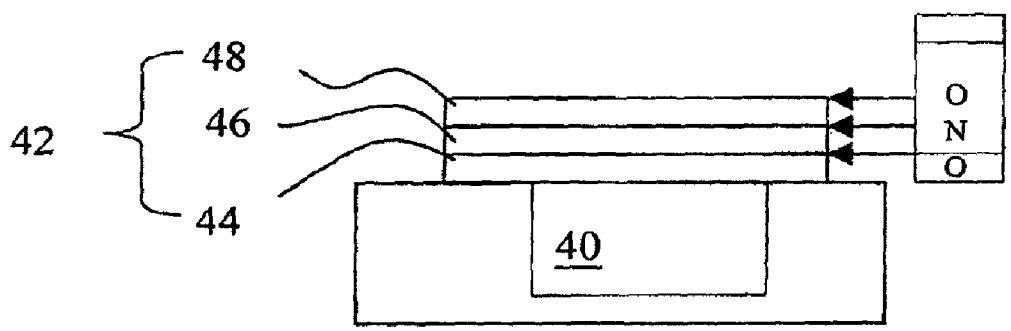

What shown in FIGS. 3A~3E are the schematic drawings of the manufacturing method of the non-volatile memory in according to a preferred example of this invention. First, build a base 40 in FIG. 3A, for example using silicon base. Then, as shown in FIG. 3B, build a gate dielectric layer 42 on the base 40. The gate dielectric layer contains at least two layers of different material layers. It is a three-layer material layer in this example. From bottom to top in sequence are a first oxide layer 44, a charge storage layer 46 and a second oxide layer 48. The oxide in the first oxide layer 44 and the second oxide layer 48 is silicon oxide ($SiO_2$) while the material for the charge storage layer 46 is silicon nitride ($Si_3N_4$). Thus a gate dielectric layer 42 with an ONO layer structure is formed on the base 40.

Figure 3C:
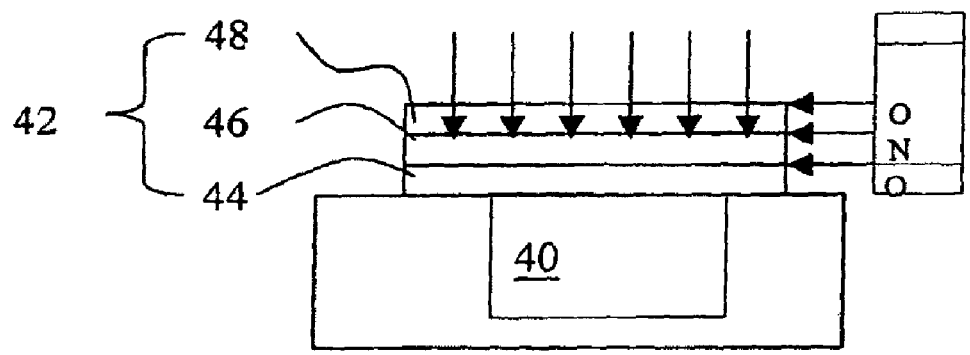

Then, as shown in FIG. 3C, process the planting of the hetero elements on the gate dielectric layer 42. For the case that the charge storage layer is silicon nitride, one can use Germanium (Ge), Silicon (Si), Nitrogen (N₂), Oxygen (Oi), Nitrogen (N), Oxygen (O)' separately or mixture in any proportion, or combined hetero elements with the above elements (implies synthetic compounds) to create deeper electron trap density.

This will make the electrons be stored more stably in charge storage layer 46 and effectively increase electron trap density. Also, under the effect of hetero elements, we can decrease significantly the case of combination of different bites on both sides. Thus, we can effectively extend the retention time of the charge storage layer 46 and effectively solve the bite combination problem.

The charge storage layer 46 does not limit its material to silicon carbide. One can also use for example aluminum oxide ($Al_2O_3$) to achieve the effects of this invention as long as to corporate with appropriate hetero elements to make the electrons to be more stably stored in charge storage layer 46.

Besides, as to the increasing of electron trap density through the planting of hetero elements, the particle diameter of those hetero elements have minimum value which are equal to the size of atoms (~0.3 nanometer). Therefore, this invention can be applied in the manufacturing of nanometric grade flash memory.

Figure 3D:
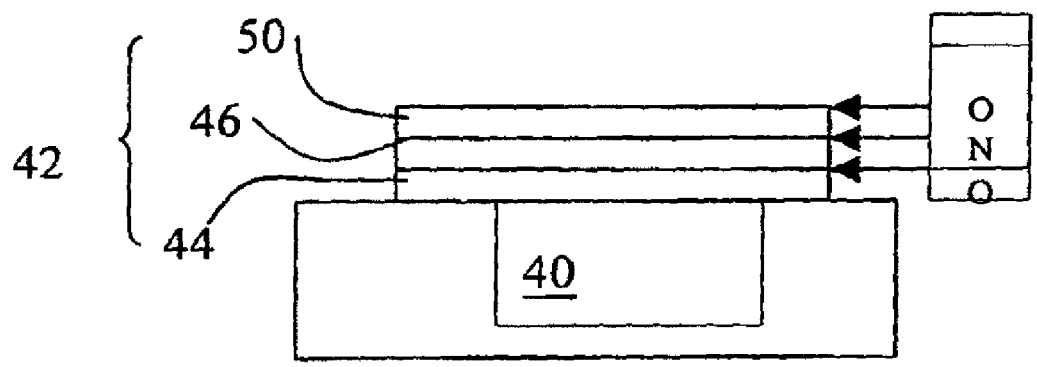

As the quality of the top oxide layer 48 on the gate dielectric layer 42 will be damaged after the planting of hetero elements and cause defects within the oxide layer, electrons stored in the charge storage layer 46 will be loss away through the top oxide layer 48. Therefore, as shown in FIG. 3D, we can remove the top oxide layer first after the planting of the hetero elements, then we grow a high quality top oxide layer 50 to improve the phenomena of electron loss.

Figure 3E:
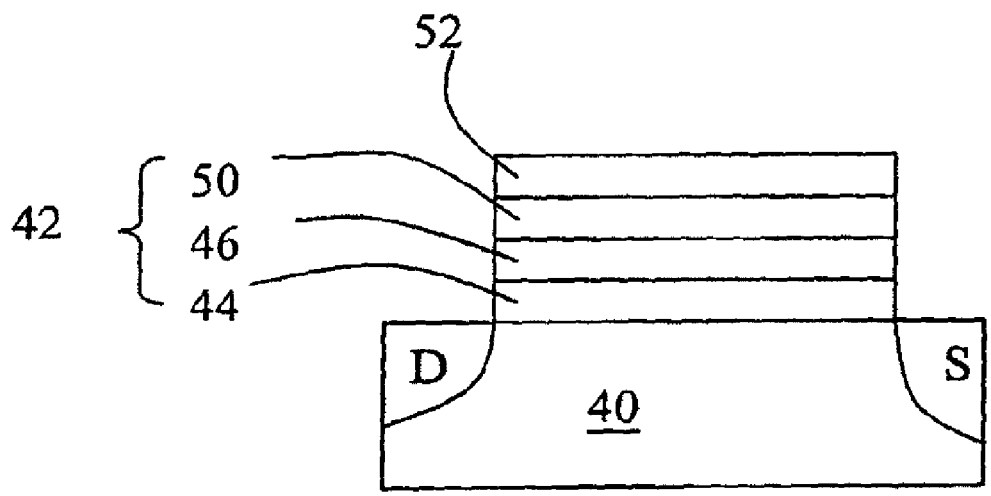

Finally, as shown in FIG. 3E, form a gate electrode layer 52 on the top of gate electrode layer 42. Then form separately a source electrode S and a drain electrode D at the base 40 at both sides of the gate dielectric layer 42. Thus, the manufacturing of the non-volatile memory of this invention is completed.

The non-volatile memories fabricated by the above-mentioned steps as shown in FIGS. 3A~3E have advantages below:

(1) The charge storage layer will increase the electron trap density after being planted with hetero elements. The electrons will be stored more stably in charge storage layer. Thus, we can effectively extend the retention time of the charge storage layer and effectively solve the bite combination problem.

(2) The top oxide layer is reformed at last step. This will effectively decrease the damage of the quality caused by the planting of hetero elements and prevent the electrons to loss away through the top oxide layer material after removing the up most layer of material. Finally, build a gate electrode layer on the gate dielectric layer and form source/drain electrodes at the bases of both sides of the gate dielectric layer.

While the invention has been particularly shown and described with reference to a preferred embodiment, it will be understood by those skilled in the art that various changes in form and detail may be made therein without departing from the spirit and scope of the invention. Therefore, the protection range should be determined based on the defined ranges in the claims attached below.

The invention claimed is:

1. A non-volatile memory structure is consisted of:
   a substrate with a first region, a second region, and a third region, wherein said first region, said second region, and said third region are different;
   a first dielectric layer formed with a first material on said second region of the substrate;
   a second dielectric layer formed with a second material on said first dielectric layer;
   a third dielectric layer formed with a third material on said second dielectric layer;
   a source electrode formed at said first region of said substrate;
   a drain electrode formed at said third region of said substrate; and
   a gate electrode layer formed on said third gate dielectric layer;
   wherein said first material is different from the second material;
      said second dielectric layer comprises one hetero element equals to 0.3 nanometer in size selecting from a group consisting of germanium and silicon; and
      one of said first material, said second material, and said third material is silicon carbide.

2. A non-volatile memory structure comprising:
   a substrate with a first region, a second region, and a third region, wherein said first region, said second region, and said third region are different;
   a first dielectric layer formed with a first material on the second region of the substrate,
   a second dielectric layer formed with a second material on said first dielectric layer;
   a third dielectric layer formed with a third material on said second dielectric layer;
   a source electrode formed at said first region of said substrate;
   a drain electrode formed at said third region of said substrate; and
   a gate electrode layer formed on said third gate dielectric layer;
   wherein said first material is different from the second material;
      said second dielectric layer comprises one hetero element equals to 0.3 nanometer in size selecting from a group consisting of germanium and silicon; and
      one of said first material, said second material, and said third material is aluminum oxide (Al2O3).

* * * * *

UNITED STATES PATENT AND TRADEMARK OFFICE
CERTIFICATE OF CORRECTION

| | | |
|---|---|---|
| PATENT NO. | : 7,777,267 B2 | Page 1 of 1 |
| APPLICATION NO. | : 11/969119 | |
| DATED | : August 17, 2010 | |
| INVENTOR(S) | : Jeng et al. | |

It is certified that error appears in the above-identified patent and that said Letters Patent is hereby corrected as shown below:

Title page, item [73] Assignee should read as follows:

CHUNG YUAN CHRISTIAN UNIVERSITY, TAOYUAN, TAIWAN

Signed and Sealed this
Nineteenth Day of July, 2011

David J. Kappos
*Director of the United States Patent and Trademark Office*